(12) United States Patent
King Jr. et al.

(10) Patent No.: US 6,870,093 B2
(45) Date of Patent: Mar. 22, 2005

(54) ADAPTABLE EMI/RFI SHIELDING FOR A FRONT-PANEL ATTACHMENT TO AN ENCLOSURE

(75) Inventors: Joseph P. King Jr., Sterling, MA (US); Gerald J. Cote, Westborough, MA (US); Albert F. Beinor, Jr., Sutton, MA (US)

(73) Assignee: EMC Corporation, Hopkinton, MA (US)

(*) Notice: Subject to any disclaimer, the term of this patent is extended or adjusted under 35 U.S.C. 154(b) by 41 days.

(21) Appl. No.: 10/606,617

(22) Filed: Jun. 26, 2003

(65) Prior Publication Data

US 2005/0006118 A1 Jan. 13, 2005

(51) Int. Cl.[7] .................................................. H05K 9/00
(52) U.S. Cl. ............................... 174/35 GC; 361/816; 361/818
(58) Field of Search .......................... 174/35 GC, 35 R, 174/35 MS; 361/752, 753, 799, 800, 816, 818; 277/920

(56) References Cited

U.S. PATENT DOCUMENTS

| | | | |
|---|---|---|---|
| 4,999,459 A | | 3/1991 | Smith et al. |
| 5,365,285 A | | 11/1994 | Kizuya et al. |
| 6,239,359 B1 | * | 5/2001 | Lilienthal et al. ...... 174/35 GC |
| 6,515,871 B1 | * | 2/2003 | Stark et al. .................. 361/818 |
| 6,544,047 B2 | * | 4/2003 | Moore .......................... 439/95 |
| 6,563,042 B2 | * | 5/2003 | Barabash .................. 174/35 R |
| 6,608,251 B1 | * | 8/2003 | Nurmi .................... 174/35 GC |
| 2001/0003406 A1 | | 6/2001 | Bertolami |
| 2002/0017838 A1 | | 2/2002 | Roesner et al. |
| 2002/0064349 A1 | | 5/2002 | Ngo et al. |

\* cited by examiner

*Primary Examiner*—Dean A. Reichard
*Assistant Examiner*—Carmelo Oliva
(74) *Attorney, Agent, or Firm*—Guerin & Rodriguez, LLP; Michael Rodriguez

(57) ABSTRACT

Described is an adaptable EMI/RFI shielding for a panel. The shield includes an electrically conductive shield having first and second sides and a gasket attached on the first side at a periphery of the shield. The shield has a slot formed therein. A panel portion has a front wall and side walls defining an interior region. The panel portion also includes a spring receptacle and a snap that each extends substantially perpendicular from the front wall within the interior region. The spring receptacle has a spring inserted therein with a portion of the spring extending out of the spring receptacle. The snap has a hook at one end of the snap. The spring urges against the second side of the shield and the hook enters the slot and catches onto the first side of the shield when the shield is attached to the panel portion.

12 Claims, 5 Drawing Sheets

ADAPTABLE EMI/RFI SHIELDING FOR A FRONT-PANEL ATTACHMENT TO AN ENCLOSURE

FIELD OF THE INVENTION

The invention relates generally to a sealing arrangement for enclosures housing electrical equipment. More particularly, the invention relates to adaptable electromagnetic interference or radio frequency interference (EMI/RFI) shielding for panels of such enclosures.

BACKGROUND

Some electronic devices emit electromagnetic radiation. To prevent deleterious interference of electromagnetic radiation upon other electronic equipment, limits are placed on the permissible amount of electromagnetic emissions from enclosures housing electronic devices. To comply with these limits, enclosures are typically sealed and made of conductive material. Invariably, one or more of the panels of the sealed enclosure are removable from the chassis of an enclosure to provide access to the electronic devices or boards housed therein. The interface between the removable panel and the chassis is an area of vulnerability for EMI/RFI leakage. To prevent EMI/RFI leakage, generally, a tight seal is needed between the removable panel and the chassis.

One solution is to affix an EMI/RFI shield to the removable panel. The EMI/RFI shield has a resilient gasket that presses against a surface of the chassis when the removable panel is attached to the chassis. The contact between the gasket and the chassis surface produces an effective EMI/RFI blocking seal.

A disadvantage to this solution, however, is that manufacturing tolerances of the panel, shield, and chassis can require the installer to exert an inordinate amount of force to attach the panel to the chassis. Thus there remains a need for removable panels that have effective EMI/RFI shielding characteristics, are adaptable to the manufacturing tolerances, and are not difficult to install to the chassis.

SUMMARY

In one aspect, the invention features an apparatus comprising an electromagnetic interference and radio frequency interference (EMI/RFI) shield having first and second sides and a gasket attached on the first side at a periphery of the EMI/RFI shield. The EMI/RFI shield has a slot formed therein. A panel portion has a front wall and side walls defining an interior region. In this interior region, the panel portion has a spring receptacle and a snap that each extends substantially perpendicular from the front wall. The spring receptacle has a spring inserted therein with a portion of the spring extending out of the spring receptacle for pressing the second side of the EMI/RFI shield when the panel portion is attached to the EMI/RFI shield. The snap has a hook at one end of the snap for catching the first side of the EMI/RFI shield when the portion of the spring extending out of the spring receptacle presses the second side of the EMI/RFI shield.

In another aspect, the invention features an enclosure for housing electronic components. The enclosure comprises a chassis, having a catch, and an assembly. The assembly includes an electrically conductive shield attached to a panel portion. The electrically conductive shield has first and second sides, a gasket attached to the first side at a periphery of the shield, and a slot formed therein. The panel portion has a front and side walls defining an interior region. In the interior region, the panel portion has a spring receptacle and a snap that each extends substantially perpendicular from the front wall and a latch for engaging the catch of the chassis when attaching the assembly to the chassis. The spring receptacle has a spring inserted therein with a portion of the spring extending out of the spring receptacle for pressing the second side of the EMI/RFI shield when the panel portion is attached to the EMI/RFI shield. The snap has a hook at one end for catching the first side of the EMI/RFI shield when the portion of the spring extending out of the spring receptacle presses the second side of the EMI/RFI shield. When the assembly is attached to the chassis, the gasket on the EMI/RFI shield contacts the chassis causing the spring to compress and permit movement of the EMI/RFI shield with respect to the panel portion until the latch engages the catch of the chassis, the contact between the gasket and the chassis producing an EMI/RFI seal.

In yet another aspect, the invention features an assembly for providing electromagnetic interference and radio frequency interference (EMI/RFI) shielding for an enclosure housing electronic components. The assembly comprises an electrically conductive shield having first and second sides and a gasket attached on the first side at a periphery of the shield. A panel portion has means for applying an adaptable force against the second side of the shield when the panel portion is attached to the shield. Means for attaching the panel portion to the shield applies a force to the first side of the shield to offset the force applied by the panel portion to the second side of the shield.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

The present invention is useful for providing electromagnetic interference and radio frequency interference (EMI/RFI) shielding for enclosures installed in data storage racks. Such enclosures typically house multiple disk modules, one or more power supplies, link control cards, or combinations thereof. In brief overview, the present invention features an adaptable interface between an EMI/RFI shield and a removable panel. The adaptable interface compensates for manufacturing tolerances associated with the panel, with the EMI/RFI shield, and with the chassis of the enclosure, in particular, when the panel and shield are attached to the chassis. Although described below with respect to front panels of data storage enclosures, the invention applies also to other removable panels, such as top, bottom, rear and side panels, and other types of enclosures that house electronic equipment.

Figure 1:
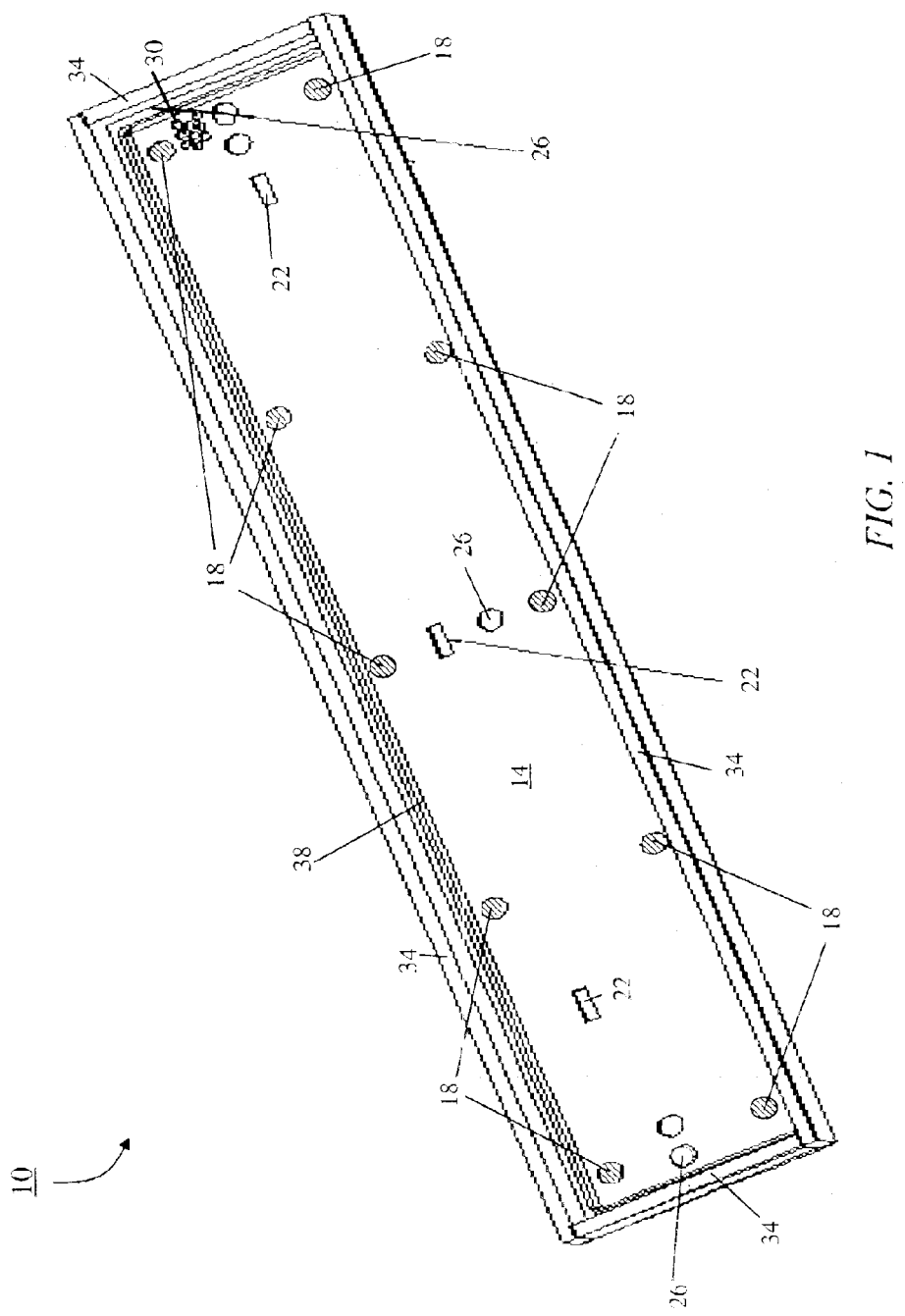
FIG. 1 is a top view of an embodiment of an EMI/RFI shield constructed in accordance with the principles of the invention.

FIG. 1 shows one side of an embodiment of an EMI/RFI shield 10 constructed in accordance with the principles of the invention. This side of the EMI/RFI shield 10 faces a chassis of an enclosure. The other side (not shown) of the EMI/RFI shield 10 faces a removable panel, described below in connection with FIG. 2. The EMI shield 10 is generally rectangular in shape having a planar portion 14 and made of electrically conductive material. The planar portion 14 has a plurality of spring pads 18, a plurality of slots 22, a plurality of alignment holes 26, and a plurality of air passages 30. The spring pads are slight depressions (e.g., circular) in the other side of the planar portion 14 (not shown). Other embodiments have fewer and other embodiments have more spring pads 18, slots 22, alignment holes 26, or air passages 30 than those shown. Typically, the air passages 30 cover much of the planar portion 14 to provide for air flow therethrough. In other embodiments, the planar portion 14 includes fastener openings instead of or in addition to the slots 22.

On the side facing the chassis, the EMI/RMI shield 10 has a resilient gasket 34 affixed to the periphery of the EMI/RFI shield 10. In one embodiment, the gasket 34 is made of urethane foam that is covered with nickel-plated silver on nylon rib stop. The material of the gasket 34 provides an effective EMI/RFI seal when the gasket 34 is pressed against the chassis. With respect to the plane of the planar portion 14, the periphery is slightly raised. In FIG. 1, a, downward sloping edge from the periphery to the planar portion 14 is denoted by reference numeral 38.

Figure 2:
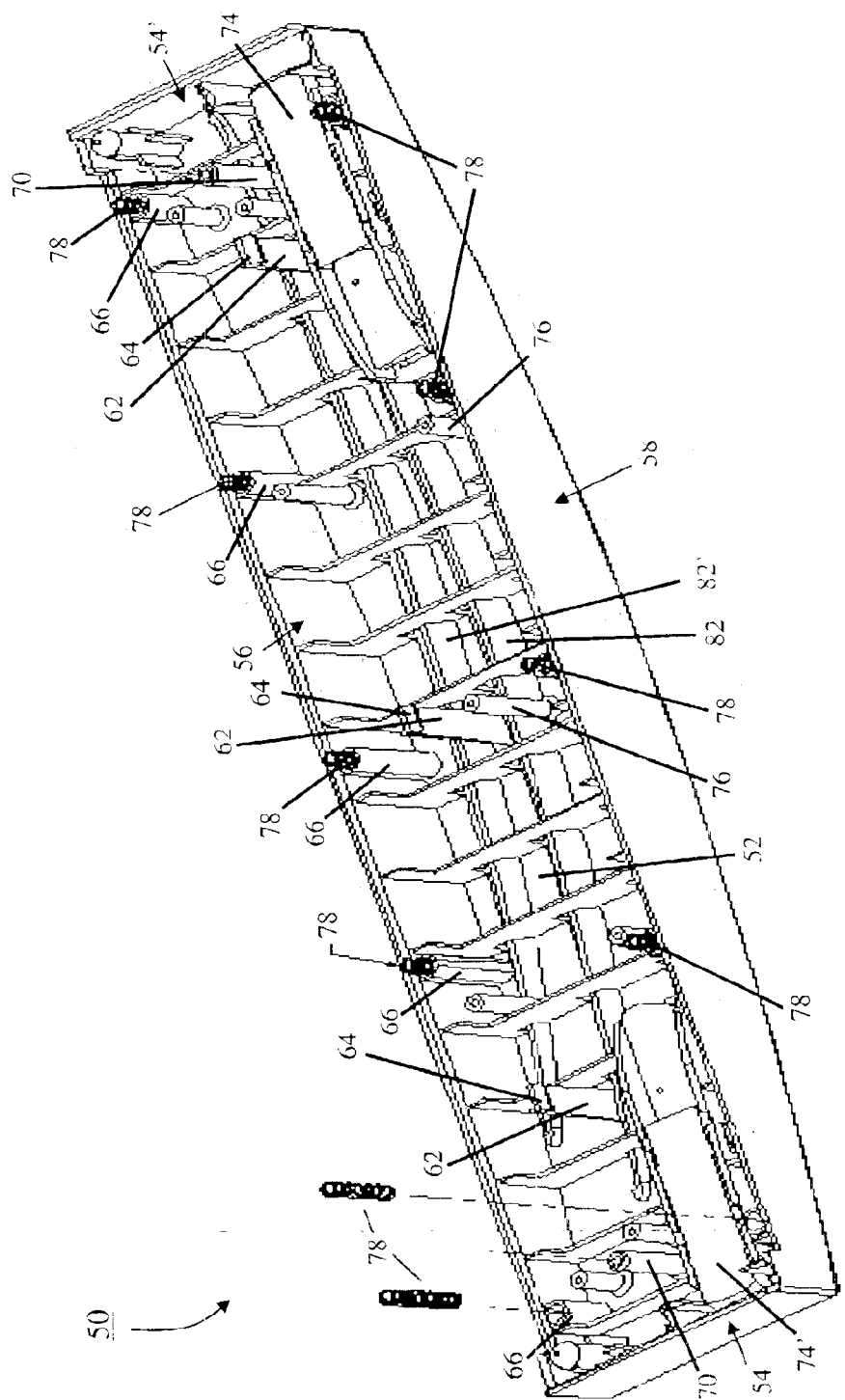
FIG. 2 is a top view of a panel constructed in accordance with the principles of the invention.

FIG. 2 shows a back side of a removable panel 50 (here, a front panel) constructed in accordance with the principles of the invention. The front panel 50 is made of an integral piece of material (e.g., plastic) and includes a front wall 52, side walls 54, 54', a top side wall 56, and a bottom side wall 58 that define an interior region. The length of the front panel 50 (i.e., the length of the top and bottom side walls 56, 58) is longer than the length of the EMI/RFI shield 10 of FIG. 1. The width of the front panel 50 (i.e., the length of the side walls 54, 54') is approximately the same as the width of the EMI/RFI shield 10. The top and bottom side walls 56, 58 each have a notched region for receiving the EMI/RFI shield 10. The height of the top side wall 56, as measured from the front wall 52, within the notched region is lower than those regions of the top side wall 56 on both sides of the notched region. A similar height difference is present along the bottom side wall 58 as well.

Extending substantially perpendicularly from the front wall 52, the front panel 50 includes a plurality of snaps 62, a plurality of spaced-apart spring receptacles 66, and a plurality of locator bosses 70. The number of snaps 62 corresponds to the number of slots 22 in the EMI/RMI shield 10, the number of spring receptacles 66 with the number of spring pads 18, and the number of locator bosses 70 with the number of alignment holes 26 (see FIG. 1). The front wall 52 has a plurality of curved, elongated air vents 82, 82' formed therethrough. The elongated air vents 82, 82' extend in a lengthwise direction (i.e., from side walls 54 to side wall 54').

The snaps 62 are located along a curved top edge of the air vent 82. Each snap 62 has a hook 64 at one end of a stem.

The height of the stem is such that the hook 64 of each snap 62 extends "above" or is higher than the notched regions of the top and bottom walls 56, 58. The hooks 64 operate to secure the front panel 50 to the EMI/RFI shield, as described further below. The front panel 50 has a plurality of fastener receptacles 76 to provide an alternative or supplemental means for securing the front panel 50 to the EMI/RFI shield 10. The fastener receptacles 76 are threaded to receive a threaded fastener, such as a screw. In some embodiments, the fastener receptacles 76 are not included in the front panel 50.

The spring receptacles 66 are arranged in two rows, one row aligned alongside of the top wall 56 and another row aligned alongside the bottom wall 58. Before attaching the front panel 50 to the EMI/RFI shield 10, each spring receptacle 66 has a spring 78 inserted therein. A portion of the spring 78 (e.g., one-third, one-half) extends out of the spring receptacle 66.

The locator bosses 70 are located at opposite ends of the front panel 50, one being near the side wall 54 and the other being near the side wall 54'. Another locator boss 70 is positioned centrally in the front panel 50.

A pair of latches 74, 74' is installed within the front panel 50 for attaching the front-panel-and-shield assembly to the chassis. One latch 74 is installed on either side of the front panel 50. Each latch 74, 74' includes a plunger, not seen, that extends laterally towards a respective side wall 54, 54' and which snaps into appropriately positioned catches extending from the chassis, to attach the front-panel-and-shield assembly to the chassis.

Figure 3:
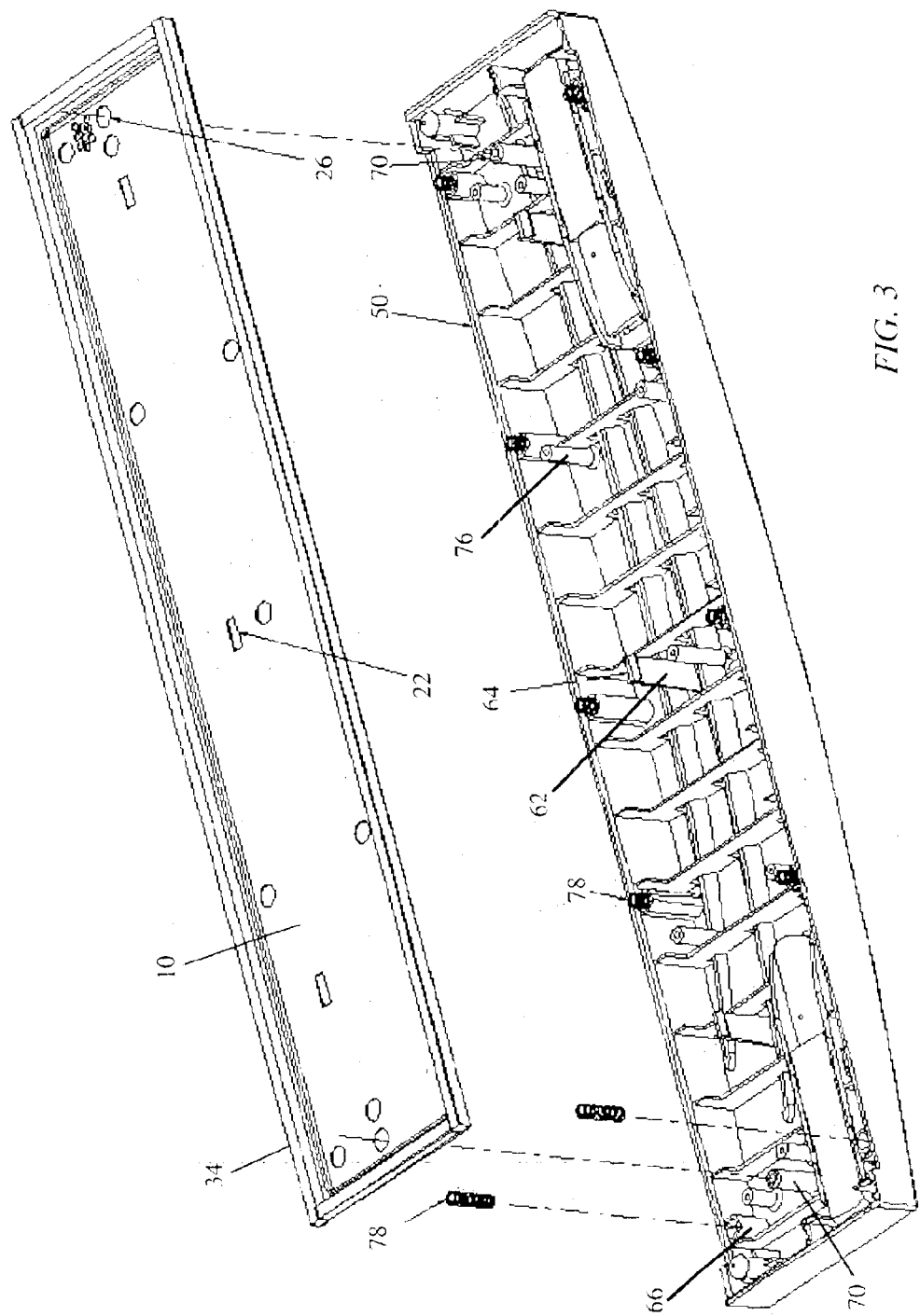
FIG. 3 is a view of the EMI/RFI shield aligned with the front panel for attachment.

FIG. 3 shows the EMI/RFI shield 10 of FIG. 1 aligned for attachment with the front panel 50 of FIG. 2. To attach the EMI/RFI shield 10 to the front panel 50, an assembler aligns the hooks 64 of the snaps 62 of the panel 50 to pass through the slots 22 of the shield 10 and the locator bosses 70 to pass through the alignment holes 26. After so aligning, the assembler urges the EMI/RFI shield 10 and front panel 50 together such that a sloped leading surface of each hook 64 contacts an edge of the slot opening. The pressure of the slot edge against this sloped surface of the hook 64 causes the stem to bend away from the slot edge. The sloped surface thus guides the hook 64 into the slot 22. When the hook 64 of each snap 62 passes completely through the slot 22, the stem returns to its unbent position. Consequently, the hook 64 of the snap 62 catches a back surface at the edge of the slot 22.

Urging the EMI/RFI shield 10 and front panel 50 together also brings the springs 78 within the spring receptacles 66 into contact with a respective one of the spring pads 18 on the EMI/RFI shield 10. Once the springs 78 contact the spring pad, additional pressure pushes the hooks 64 through the slots 22 and compresses the springs 78. When the assembler releases this pressure, after the hooks 64 are completely through the slots 22, the action of the springs 78 urges the EMI/RFI shield 10 away from the front panel 50 and causes the hooks 64 of the snaps 62 to catch the back edges of the slots 22. Thus the springs 78 and snaps 62 operate to secure the shield 10 to the front panel 50 to produce a front-panel-and-shield assembly. Although this embodiment is described with three snaps 62, a single snap 62, preferably in the center of the front panel 50, can be used to practice the invention. Alternatively, or in addition to one or more snaps 62, a fastener such as a screw can be used to secure the front panel 50 to the EMI/RFI shield 10. Each fastener passes through a fastener opening in the EMI/RFI shield 10 and enters the aligned fastener receptacle 76.

Whether through the use of snaps 62, fasteners, or a combination of these and other means of attachment, the attachment is such that the EMI/RFI shield 10 is able to move relative to the front panel 50. Determined by the amount of compression of the springs 78, the range of movement of EMI/RFI shield 10 ranges from being in contact with the notched edges of the top 56 and bottom 58 walls of the front panel 50 to being in contact with the hook 64 of the snap 62 (or the head of a fastener). This range of movement compensates for manufacturing tolerances when the front-panel-and-shield assembly is attached to the chassis.

Figure 4:
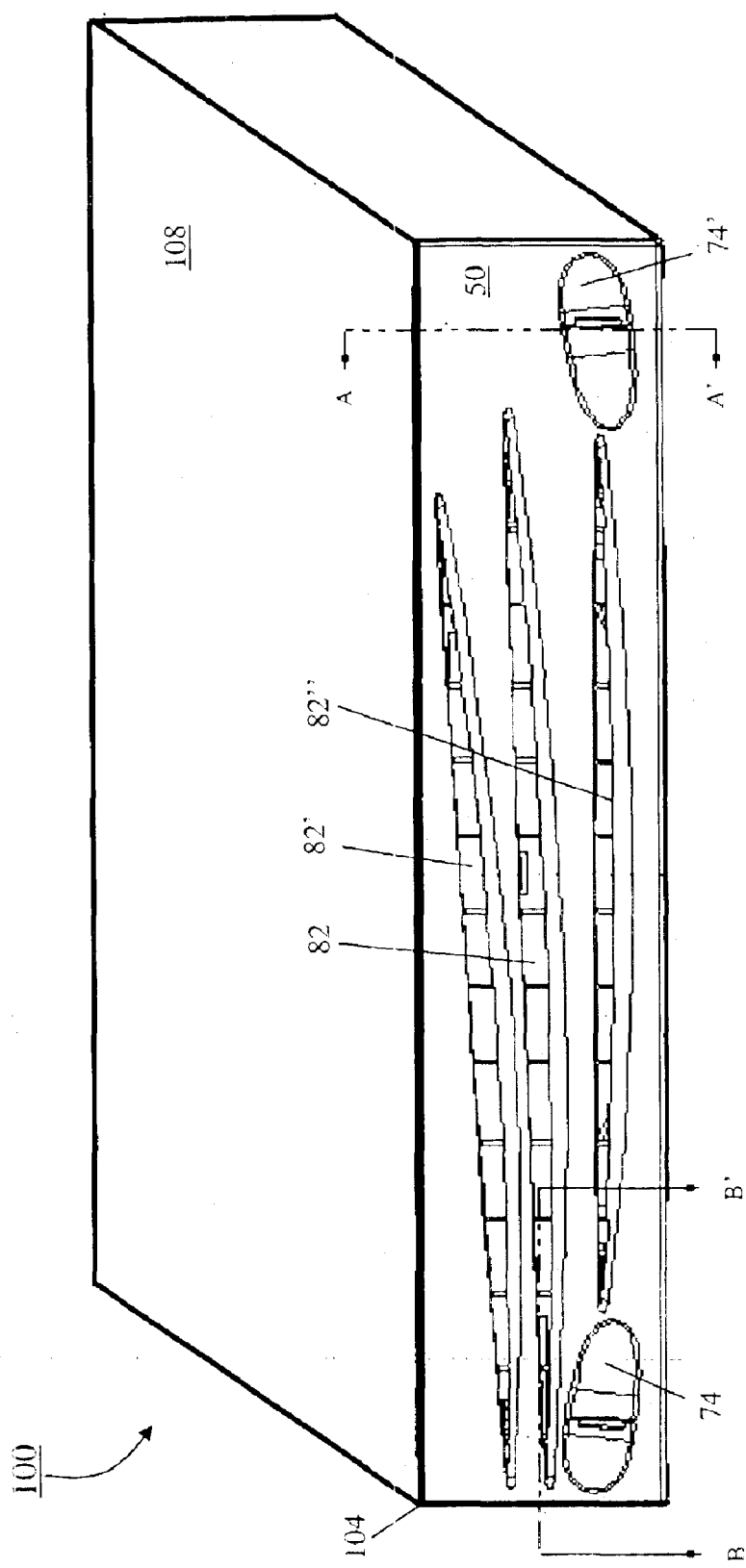
FIG. 4 is a view of an embodiment of an enclosure with an attached front-panel-and shield assembly of the present invention.

FIG. 4 shows an embodiment of an enclosure 100 for housing disk drives with a front-panel-and-shield assembly 104 of the present invention attached to a chassis 108 of the enclosure 100. In this FIG. 4, the front panel 50 obscures the EMI/RFI shield 10 (FIG. 3), except for those portions of the EMI/RFI shield 10 that are visible through the elongated air vents 82, 82' and 82".

When attaching the front-panel-and-shield assembly 104 to the chassis 108, an assembler aligns the assembly with the chassis opening and pushes the gasket 34 on the EMI/RFI shield 10 against a surface of the chassis 108. The size of the gasket 34 is such that the gasket 34 bounds the chassis opening when in contact with this surface. The force of the chassis 108 against the gasket 34 causes the springs 78 to compress. The compressibility of the springs 78 enables movement of the EMI/RFI shield 10 toward the front panel 50 along the axis of compression of the springs 78. (When the springs 78 are so compressed, the hooks 64 of the snaps 62 may no longer be in contact with the surface of the EMI/RFI shield 10.) The assembler continues to push the gasket 34 against the chassis 108 until the plungers of the latches 74 snap into the catches of the chassis 108. After the assembly is latched, the springs 78 maintain a force against the EMI/RFI shield 10 and, thus, the gasket 34 is continually urged against the chassis 108. The contact between the gasket 34 and the surface of the chassis 108 produce an EMI/RFI seal.

Because manufacturing tolerances can produce variability in the construction of the various components, attaching different panel-and-shield assemblies to the chassis 108 can require different degrees of spring compression. The adaptable interface of the invention enables the assembler to exert that amount of force sufficient for each particular panel-and-shield assembly.

Figure 5B:
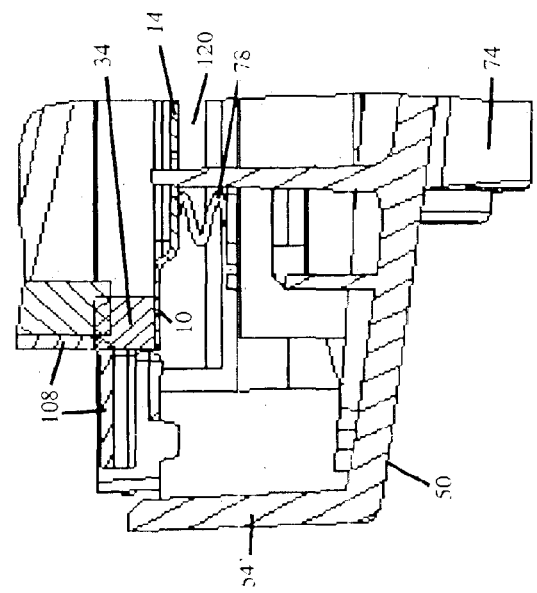
FIG. 5B is a cross-section view along line B–B' in FIG. 4 of the front-panel-and-shield assembly attached to a chassis of the enclosure in FIG. 4.
Figure 5A:
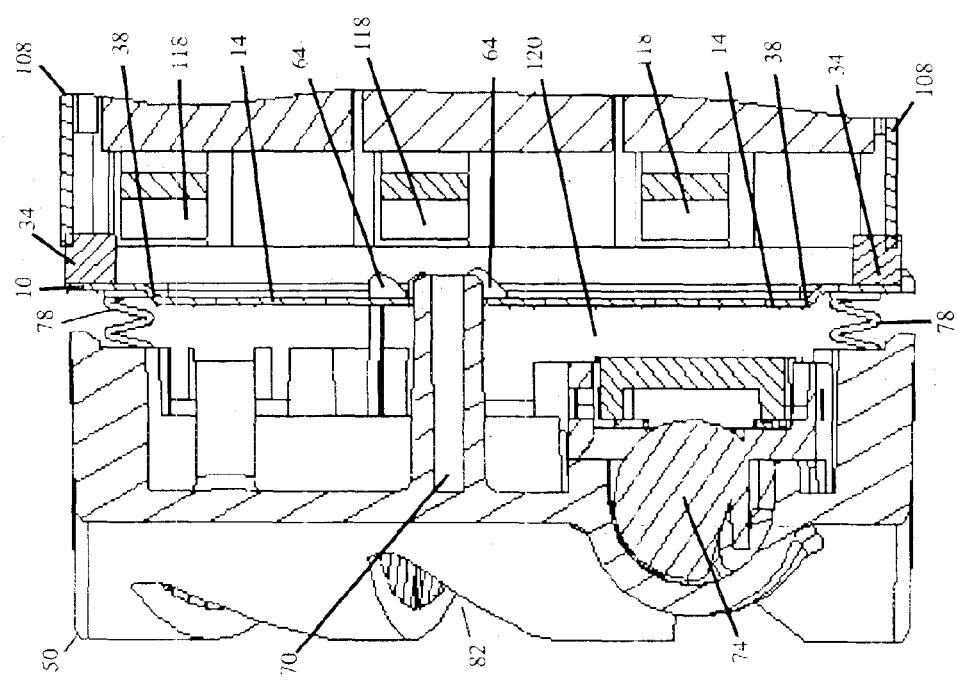
FIG. 5A is a cross-section view along line A–A' in FIG. 4 of the front-panel-and-shield assembly attached to a chassis of the enclosure in FIG. 4.

FIG. 5A shows a cross section along line A–A' in FIG. 4 of the front-panel-and-shield assembly 104 being attached to the chassis 108 of the enclosure 1100. The cross section shows the front panel 50 being secured to the EMI/RFI shield 10 by the springs 78 pressing against one side of the shield 10 and the hooks 64 catching the other side of the shield 10. The gasket 34 is in interference with the chassis 108 to produce part of an EMI/RFI seal. Shown within the chassis 108 are cross sections of three disk drive modules 118.

The cross section also shows the "raised" periphery of the EMI/RFI seal with respect to the planar portion 14 and the sloping edge 38 therebetween. This shape for the EMI/RFI shield 10 provides for a structurally stronger shield 10 than an entirely flat construction. Note that some of the side wall 54' (FIG. 2) has been left out of FIG. 5A to more clearly show the separation 120 between the EMI/RFI shield 10 and the front panel 50 because of the springs 78.

FIG. 5B shows a cross section along line B–B' in FIG. 4 of the front-panel-and-shield assembly 104 being attached to the chassis 108 of the enclosure 100. As a result of the attachment, the gasket 34 is in interference with the chassis 108 to produce part of the EMI/RFI seal. This cross section also shows one of the springs 78 pressing against one side of the EMI/RFI shield 10 and the separation 120 between the EMI/RFI shield 10 and the front panel 50.

While the invention has been shown and described with reference to specific preferred embodiments, it should be understood by those skilled in the art that various changes in form and detail may be made therein without departing from the spirit and scope of the invention as defined by the following claims.

What is claimed is:

1. An apparatus comprising:

an electromagnetic interference and radio frequency interference (EMI/RFI) shield having first and second sides and a gasket attached on the first side at a periphery of the EMI/RFI shield, the EMI/RFI shield having a slot formed therein; and a panel portion having a front wall and side walls defining an interior region, the panel portion having in the interior region a spring receptacle and a snap that each extends substantially perpendicular from the front wall, the spring receptacle having a spring inserted therein with a portion of the spring extending out of the spring receptacle for pressing the second side of the EMI/RFI shield when the panel portion is attached to the EMI/RFI shield and the snap having a hook at one end for catching the first side of the EMI/RFI shield when the portion of the spring extending out of the spring receptacle presses the second side of the EMI/RFI shield.

2. The apparatus of claim 1, wherein the EMI/RFI shield has a periphery portion and a planar portion and the spring presses the periphery portion of the EMI/RFI shield when the panel is attached to the EMI/RFI shield.

3. The apparatus of claim 2, wherein the planar portion is indented with respect to the periphery portion.

4. The apparatus of claim 1, wherein the panel portion includes a boss and the EMI/RFI shield includes an alignment hole for receiving the boss to facilitate attaching the panel portion to the EMI/RFI shield.

5. An enclosure for housing electronic components, the enclosure comprising:

a chassis having a catch;

an assembly including an electrically conductive shield attached to a panel portion, the electrically conductive shield having first and second sides, a gasket attached to the first side at a periphery of the shield, and a slot formed therein, the panel portion having a front wall and side walls defining an interior region, the panel portion having in the interior region a spring receptacle and a snap that each extends substantially perpendicularly from the front wall and a latch for engaging the catch of the chassis, the spring receptacle having a spring inserted therein with a portion of the spring extending out of the spring receptacle and pressing the second side of the EMI/RFI shield, the snap having a hook at one end that catches the first side of the EMI/RFI shield when the spring presses the second side of the EMI/RFI shield, wherein the spring compresses and enables movement of the EMI/RFI shield toward the panel portion when the gasket of the assembly is pressed against the chassis until the latch engages the catch of the chassis, the pressure of the gasket against the chassis producing an EMI/RFI seal.

6. The apparatus of claim 5, wherein the EMI/RFI shield has a periphery portion and a planar portion and the spring presses the periphery portion of the EMI/RFI shield when the panel portion is attached to the EMI/RFI shield.

7. The apparatus of claim 6, wherein the planar portion is indented with respect to the periphery portion.

8. The apparatus of claim 5, wherein the panel portion includes a boss and the EMI/RFI shield includes an alignment hole for receiving the boss to facilitate attaching the panel, portion to the EMI/RFI shield.

9. An enclosure for housing electronic components, the enclosure comprising:

an electrically conductive shield having first and second sides and a gasket attached on the first side at a periphery of the electrically conductive shield;

a panel portion having means for applying an adaptable force against the second side of the electrically conductive shield when the panel portion is attached to the electrically conductive shield; and means for attaching the panel portion to the electrically conductive shield capable of applying a force to the first side of the shield to offset the force applied by the panel portion to the second side of the electrically conductive shield.

10. The enclosure of claim 9, wherein the means for attaching includes a snap that extends substantially perpendicularly from an interior region of the panel portion and a slot in the electrically conductive shield, the snap having a hook at one end that enters and catches an edge of the slot on the first side of the electrically conductive shield.

11. The enclosure of claim 9, wherein the means for applying an adaptable force against the second side of the electrically conductive shield includes a spring receptacle within an interior region of the panel portion, the spring receptacle having a spring inserted therein with a portion of the spring extending out of the spring receptacle and pushing against the second side of the electrically conductive shield when the panel portion is attached to the electrically conductive shield.

12. The enclosure of claim 9, further comprising a latch attached to the panel portion and a chassis having a catch, and wherein the means for applying an adaptable force enables movement of the electrically conductive shield toward the panel portion when the gasket of the assembly is pressed against the chassis until the latch engages the catch of the chassis, the pressure of the gasket against the chassis producing an EMI/RFI seal.

* * * * *

UNITED STATES PATENT AND TRADEMARK OFFICE
CERTIFICATE OF CORRECTION

PATENT NO. : 6,870,093 B2  Page 1 of 1
APPLICATION NO. : 10/606617
DATED : March 22, 2005
INVENTOR(S) : King, Jr. et al.

It is certified that error appears in the above-identified patent and that said Letters Patent is hereby corrected as shown below:

In the claims:

In claim 6, column 7 line 1, replace "apparatus" with -- enclosure --.

In claim 7, column 7 line 5, replace "apparatus" with -- enclosure --.

In claim 8, column 7 line 7, replace "apparatus" with -- enclosure --.

In claim 8, column 7 line 10, delete "," after "panel".

Signed and Sealed this

Nineteenth Day of September, 2006

JON W. DUDAS
*Director of the United States Patent and Trademark Office*